(12) United States Patent
Mostafa et al.

(10) Patent No.: US 12,719,492 B2
(45) Date of Patent: Aug. 25, 2026

(54) PROGRAMMABLE VOLTAGE TO TIME CONVERTER

(71) Applicant: Commissariat à l'énergie atomique et aux énergies alternatives, Paris (FR)

(72) Inventors: Ali Mostafa, Grenoble Cedex (FR); Franck Badets, Grenoble Cedex (FR); Emmanuel Hardy, Grenoble Cedex (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 128 days.

(21) Appl. No.: 18/763,552

(22) Filed: Jul. 3, 2024

(65) Prior Publication Data

US 2025/0015813 A1 Jan. 9, 2025

(30) Foreign Application Priority Data

Jul. 7, 2023 (FR) ...................................... 2307293

(51) Int. Cl.
*H03M 1/50* (2006.01)
*H03K 19/20* (2006.01)

(52) U.S. Cl.
CPC .............. *H03M 1/50* (2013.01); *H03K 19/20* (2013.01)

(58) Field of Classification Search
CPC ........ H03M 1/50; H03M 1/508; H03K 19/20; H03K 3/0231; H03L 7/24
See application file for complete search history.

(56) References Cited

U.S. PATENT DOCUMENTS

| | | | | |
|---|---|---|---|---|
| 11,342,903 | B2 | 5/2022 | Goux et al. | |
| 2017/0194971 | A1* | 7/2017 | Yonezawa | H03L 7/095 |
| 2018/0106695 | A1* | 4/2018 | Chabchoub | G01D 21/00 |

FOREIGN PATENT DOCUMENTS

EP 3 312 568 A1 4/2018

OTHER PUBLICATIONS

Extended European Search Report issued Nov. 22, 2024, in corresponding European Patent Application No. 24186730.8, 10 pages.

(Continued)

*Primary Examiner* — Jean B Jeanglaude
(74) *Attorney, Agent, or Firm* — Oblon, McClelland, Maier & Neustadt, L.L.P.

(57) ABSTRACT

A programmable voltage to time converter, comprising a locking frequency generator configured to generate a locking frequency; a current generator configured to generate a biasing current; a relaxation oscillator configured to be powered by the biasing current and generate an output voltage signal from the locking frequency, a gain control word, and an input voltage signal; and a phase difference block configured to determine a phase difference between a first signal corresponding to the output voltage signal and a second signal determined based on the locking frequency. The relaxation oscillator comprises a component presenting a linearly controllable characteristic. The voltage to time converter presents a gain linearly or dB-linearly controllable based on the gain control word by controlling linearly said characteristic of the component.

17 Claims, 13 Drawing Sheets

(56) References Cited

OTHER PUBLICATIONS

Preliminary French Search Report issued Mar. 8, 2024 in French Application 2307293 filed on Jul. 7, 2023, 9 pages (with English Translation of Categories of Cited Documents & Written Opinion).
Ryu et al., "A Time-Based Pipelined ADC Using Integrate-and-Fire Multiplying-DAC", IEEE Transactions on Circuits and Systems I: Regular Papers, vol. 68, No. 7, 2021, 14 pages.
Goux et al., "A 6-nW 0.0013-$mm^2$ ILO Bandpass Filter for Time-Based Feature Extraction", IEEE Solid-State Circuits Letters, vol. 3, 2020, 4 pages.
Zhang et al., "A 0.35-0.5-V 18-152 MHz Digitally Controlled Relaxation Oscillator With Adaptive Threshold Calibration in 65-nm Cmos", IEEE Transactions on Circuits and Systems-II: Express Briefs, vol. 62, No. 8, 2015, 5 pages.
Wang et al., "A 12.77-MHz On-chip Relaxation Oscillator with Digital Compensation for Loop Delay Variation", 2015 IEEE Asian Solid-State Circuits Conference, 2015, 4 pages.

* cited by examiner

PROGRAMMABLE VOLTAGE TO TIME CONVERTER

FIELD OF THE INVENTION

The invention concerns a programmable voltage to time converter, also called VTC. The voltage to time converter according to the invention has a programmable gain and/or signal bandwidth.

BACKGROUND OF THE INVENTION

The current trend in smart portable and battery-powered devices requires sensors with many low power integrate circuits such as, amplifier, analog to digital converter (ADC), and classifier to provide intelligent data collection. Designers look to a digital-oriented design of these systems to accommodate the trends of technology scaling, and lower supply voltage for power reduction.

For these reasons, high efficient analog to information architectures start to process the signal in the time domain by duty cycling the analog quantity using voltage-to-time converter block (VTC). This time-encoded signal is not limited by voltage headroom, and is considerably more robust than the analog signal when experiencing process, supply and temperature variations. It also benefit from higher frequency resolution considering technology scaling.

However, high efficient conversion need a real time signal conditioning to process a wide range of signal strength. However, VTC architectures have a low conversion gain and are usually preceded by a preamplifier stage or automatic gain control for signal conditioning.

Thus, there is an interest in providing a voltage to time converter (VTC) with a tunable gain.

In the art, the existing VTC topologies are mainly composed into two categories: variable slope (VS) VTC, and constant-slope (CS) VTC.

As for the variable slope VTC, some architectures of this type can provide a gain control but with only one degree of freedom that could be used. In other architectures of this type, the gain can be more easily tuned through the injection current. However, the output swing of this architecture is highly distorted around the limits [0, TT].

As for the constant-slope VTC, like in the previous case, some architectures of this type can provide only one degree of freedom for the gain control which can be difficultly tuned. Some other architectures provide more degrees of freedom for the gain control but their tuning can be difficultly carried out in practice.

SUMMARY OF THE INVENTION

An aim of the present invention is to provide a programmable voltage to time converter with a tunable gain, which is able to overcome the above-mentioned drawbacks of the art.

For this purpose, the inventions relates to a programmable voltage to time converter, comprising a locking frequency generator configured to generate a locking frequency, a current generator configured to generate a biasing current, a relaxation oscillator configured to be powered by the biasing current and to generate an output voltage signal from the locking frequency, a gain control word and an input voltage signal, a phase difference block configured to determine a phase difference between a first signal corresponding to the output voltage signal and a second signal determined based on the locking frequency, the relaxation oscillator comprising a component presenting a linearly controllable characteristic and the voltage to time converter presenting a gain linearly or dB-linearly controllable based on the gain control word by controlling linearly said characteristic of said component.

Alternatively, the programmable voltage to time converter comprises a phase difference block configured to determine at least one phase based on the difference between the output voltage signal issued from the relaxation oscillator and the locking frequency.

Provided with these features, the invention ensures an accurate and easy gain control of the voltage to time converter, without a preamplifier stage (comprising for example an LNA "Low Noise Amplifier") or automatic gain control for signal conditioning. Thus, the VTC according to the invention is more compact and deprived of inconveniences of the preamplifier stage or other additional components. This is achieved using a relaxation oscillator having a capacitive injection locked oscillator structure, called C-ILO. This relaxation oscillator is provided with a component presenting a linearly controllable characteristic. Thus, the gain of the whole system can be finely controlled by controlling this characteristic with tunable range and step size. The range and the step can be easily adapted to each application.

Compared with the conventional architecture, the VTC according to the invention can amplify and convert the input voltage in a one-step leading to a reduced complexity, and power consumption.

The present invention can accurately operate using a supply voltage of only several hundred millivolts while maintaining a low distortion and rail-to-rail conversion. Additionally, it is compatible with single or differential input.

The proposed VTC can be interfaced with all types of sensors, especially analog to information architecture that usually require a large SNR ("Signal-to-Noise Ratio") for better efficiency. It can advantageously be used for low power applications such as biomedical, IoT ("Internet of Things"), wake up sensors, and low power and low distortion time based ADC.

Additionally, the invention eliminates the need of large passive components (such as capacitances for example) for low pass filtering since the bandwidth is a function of the ratio of the load and injection capacities. This ratio can be chosen accordingly.

According to some embodiments, said component is an input inverter block driven at least partially by the input voltage signal and connected to an output of the relaxation oscillator; the input inverter block presenting a gain linearly controllable based on the gain control word; said characteristic corresponding to the gain of the input inverter block.

According to some embodiments, the input inverter block comprises M inverters connected in parallel and first selecting means configured to control the gain of the input inverter block by selecting among these M inverters m inventers to be driven by the input voltage signal and at least M−m−1 inverters to be driven by a voltage signal different from the input voltage signal, the number m being defined based on the gain control word.

According to some embodiments, the input inverter block further comprises K additional inverters configured to be driven by the input voltage signal, K being a constant factor; the first selecting means being configured to control the gain of the input inverter block by selecting among M+K inverters m inventers to be driven by the input voltage signal and M−m inverters to be driven by said voltage signal different from the input voltage signal.

According to some embodiments, said component is a load capacitor block a capacitance linearly controllable based on the gain control word; said characteristic corresponding to the capacitance of the load capacitor block.

According to some embodiments, the relaxation oscillator further comprises a switched injection branch configured to inject a voltage defined by the locking frequency and comprising a capacitor block defining an injection capacitance.

According to some embodiments, the injection capacitance is chosen constant for a linear control of the gain of the voltage to time converter.

According to some embodiments, the capacitor block comprises second selecting means configured to control the injection capacitance in a complementary way to said characteristic of said component, for a dB-linear control of the gain of the voltage to time converter.

According to some embodiments, the second selecting means are configured to control the injection capacitance in a linear way, based on the gain control word.

According to some embodiments, the current generator is configured to generate the biasing current based on a bandwidth control word, for a linear control of the bandwidth of the voltage to time converter.

According to some embodiments, the current generator comprises a controlling block configured to linearly control the biasing current based on the bandwidth control word.

According to some embodiments, the current generator further comprises a compensating block connected to an input of the controlling block and configured to generate, based on the gain control word, a current compensating variations of the injection capacitance.

According to some embodiments, the locking frequency generator is formed by one of the following elements:

- a regular clock to provide a constant locking frequency;
- an adaptive clock to provide an adaptive locking frequency;
- a free running relaxation oscillator powered by the biasing current and comprising a load capacitor defining a capacitance adapted to provide an adaptive locking frequency.

According to some embodiments, the locking frequency generator is formed by the relaxation oscillator and an additional relaxation oscillator connected to said relaxation oscillator to form an auto-oscillating system.

According to some embodiments, the input voltage signal is a differential voltage signal having two components, the programmable voltage to time converter comprising a relaxation oscillator for each component of the input voltage signal.

According to some embodiments, the first and second signals for the phase difference block correspond to output voltage signals issued from different relaxation oscillators.

According to some embodiments, the second signal for the phase difference block is provided by the locking frequency.

BRIEF DESCRIPTION OF THE DRAWINGS

The invention and its advantages will be better understood upon reading the following description, which is given solely by way of non-limiting example and which is made with reference to the appended drawings, in which.

DETAILED DESCRIPTION OF THE INVENTION

First Embodiment

Figure 1:
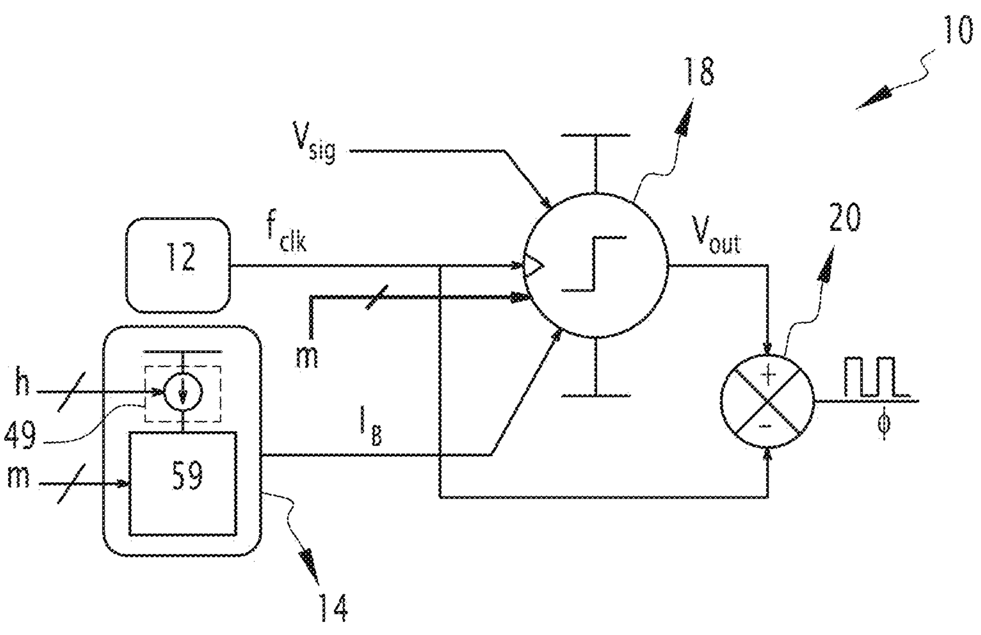
FIG. 1 is a schematic view of a voltage to time converter according to a first embodiment of the invention.

FIG. 1 shows a programmable voltage to time converter 10, also called VTC 10, according to a first embodiment of the invention.

The VTC 10 is for example usable in an analog to digital converter (ADC) and is able to provide a phase or delay or time value from an input voltage signal. The input voltage signal corresponds for example to a measuring signal. Thus, for example, the VTC 10 can be used as a component of a sensor system providing digital values of a measured physical parameter. The VTC 10 provides a phase gain normalized by a probe frequency deg/V.

The VTC 10 presents a tunable gain and signal bandwidth in respect with the given gain. The gain control is carried out using a gain control word m and the bandwidth control is carried out using a bandwidth control word h. In other words, m and h present control commands usable to tune respectfully the gain and the signal bandwidth of the VTC 10. As it will be apparent in the further description, the gain control and the signal bandwidth control of the VTC 10 are independent one from the other.

Additionally, the VTC 10 can be controlled in a linear way for moderate input signal swing (for example less than 10 dB) and in a linear in decibel way (so called dB-linear way) for wide input signal swing (for example greater than 20 dB). Each type of these controls will be explained in further detail below.

ç

As it is shown in FIG. 1, the VTC 10 comprises a locking frequency generator 12 configured to generate a locking frequency $f_{clk}$, a current generator 14 configured to generate a biasing current $I_B$, and a relaxation oscillator 18 configured to be powered by the biasing current $I_B$ and to generate an output voltage signal $V_{out}$ notably from the locking frequency $f_{clk}$ and the input voltage signal $V_{sig}$.

The VTC 10 further comprises a phase difference block 20 configured to determine a phase difference $\phi$ between a first signal corresponding to the output voltage signal $V_{out}$ and a second signal corresponding in this embodiment to the locking frequency $f_{clk}$. This phase difference block 20 can be implemented as a simple circuit implementing an XOR logic between two signals.

The relaxation oscillator 18 is based on a capacitive injection locked oscillator structure, called C-ILO. This structure presents a high swing capability, a good stability against process and temperature variations, and a less area consumption compared to analog implementation. It is explained in further detail in reference to FIG. 2.

Figure 2:
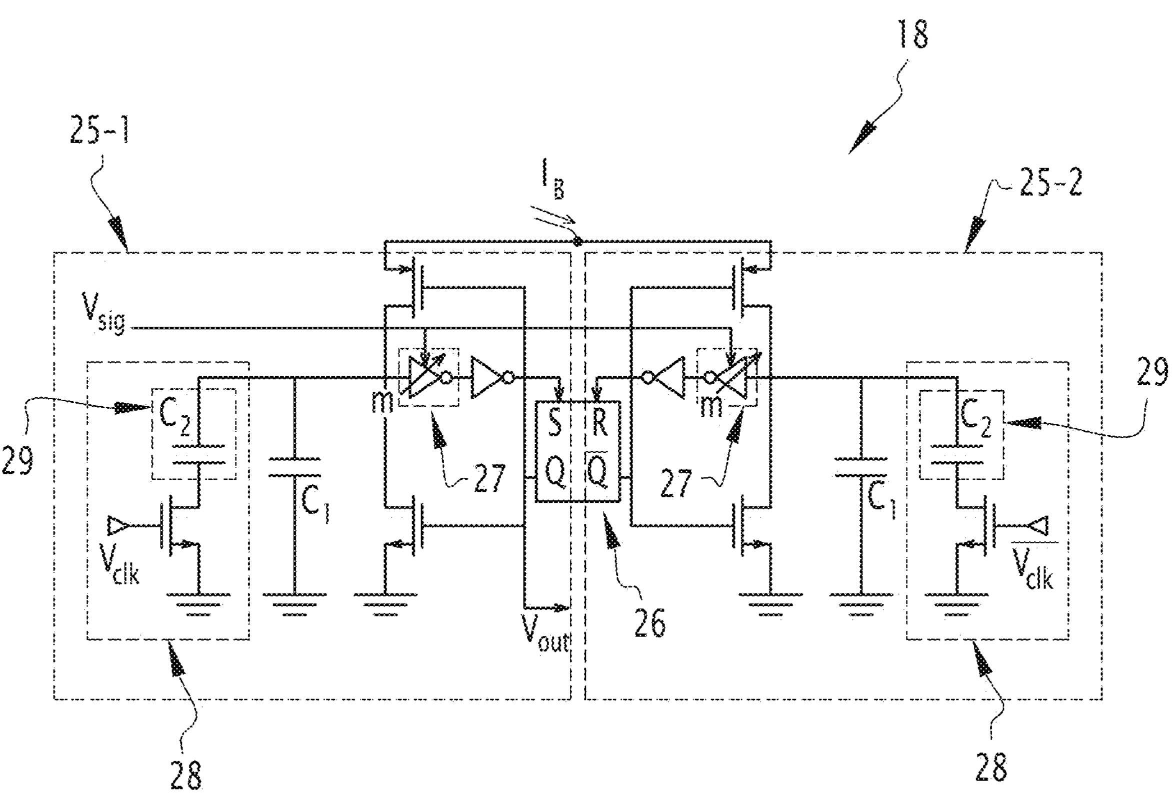
FIGS. 2 to 8 show particular 35 examples of implementation of different components of the voltage to time converter of FIG. 1.

Thus, as it is shown in FIG. 2, the relaxation oscillator 18 comprises two symmetrical parts 25-1, 25-2 powered by the biasing current $I_B$ and an RS latch 26 ("reset-set" latch) connected between the parts 25-1, 25-2. Each part 25-1, 25-2 comprises an input inverter block 27 driven by the input voltage signal $V_{sig}$, a load capacitor $C_1$ and a switched injection branch 28 with a capacitor block 29 having an injection capacitance $C_2$. Each inverter block 27 is connected between the corresponding switched injection branch 28 and the load capacitor $C_1$ on one hand and the RS latch 26 on the other hand. Additionally, each inverter block 27 is at least partially driven the input voltage signal $V_{sig}$ and presents a programmable gain $G_{INV}(m)$ based on the gain control word m, as it will be explained below in further detail. Each load capacitor $C_1$ is connected between the corresponding switched injection branch 28 and the inverter block 27. The output voltage signal $V_{out}$ is issued from one of the parts 25-1, 25-2 (part 25-1 in the example of FIG. 2).

The locking frequency generator 12 is configured to generate the locking frequency $f_{clk}$ so as the steady state phase shift $\phi_0$ of the VTC 10 in the absence of input signal $V_{sig}$, is equal to $\pi/2$. In this way, the VTC 10 exhibits a fully symmetrical output swing of ±x/2. In fact, the output swing in term of the modulated natural frequency $f_0(V_{sig})$ is given by:

$$f_0^{min} = f_{clk} \Rightarrow \quad \Rightarrow \phi = 0 \equiv \phi_0 - \pi/2$$

$$f_0^{max} = f_{clk}\left(1 + \frac{C_2}{C_1}\right) \quad \Rightarrow \phi = \pi \equiv \phi_0 + \pi/2$$

where $f_0$ is a natural frequency of the whole VTC 10, i.e. frequency in absence of the input voltage signal $V_{sig}$.

Advantageously, an optimal value of the locking frequency $f_{clk}$ when $\phi_0=\pi/2$ so it can be given determined by the following expression:

$$\phi = \phi_0 = \frac{\pi}{2} \Rightarrow f_{clk} = f_0\frac{0.5 + C_1/C_2}{1 + C_1/C_2}.$$

Different examples of implementation of the relaxation oscillator 18, the current generator 14 and the locking frequency generator 12 can be used to achieve different types of control of the VTC 10. Particularly, four different types of control of the VTC 10 that can be combined between them, can be achieved:

- linear control of the gain;
- dB-linear control of the gain;
- linear control of the bandwidth with a linear control of the gain; and
- linear control of the bandwidth with a dB-linear control of the gain.

An example of implementation for each of the types of each of the relaxation oscillator 18, the current generator 14 and locking frequency generator 12 will be given below.

Linear Control of the Gain

Relaxation Oscillator 18

According to the invention, a linear control of the gain $G_{VTC}$ of the VTC 10 can be achieved by tuning the gain $G_{INV}(m)$ of the inverter block 27 comprised in the relaxation oscillator 18, in a linear way. Particularly, the following expression can be used to control the gain $G_{INV}(m)$ of the inverter block 27:

$$G_{INV}(m) = G_{INV}^0 \times (m + 1),$$

where $$G_{INV}^0$$

is a reference gain of the inverter block 27.

Figure 3:
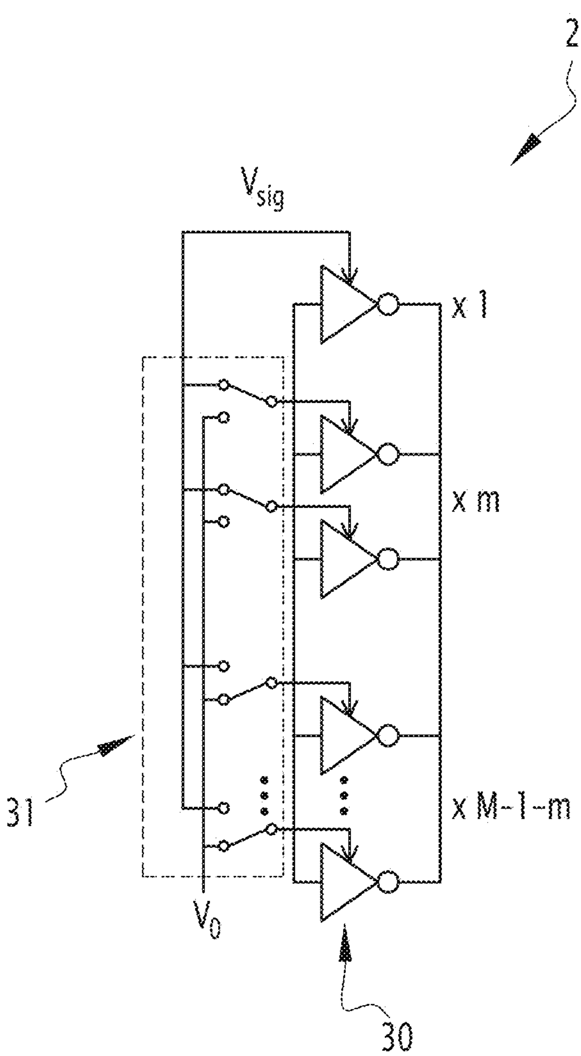

A possible embodiment of the inverter block 27 with a tunable gain $G_{INV}(m)$ for the purpose of linear control is shown in FIG. 3. According to this Figure, the inverter block 27 comprises M inverters 30 connected in parallel and first selecting means 31. Among these M inverters 30 one inverter 30 is driven always by the input voltage signal $V_{sig}$ and M−1 inverters 30 can be driven either by the input voltage $V_{sig}$ or a voltage $V_0$ different from the voltage $V_{sig}$. The voltage $V_0$ is the voltage of the VTC 10 in absence of the input voltage signal $V_{sig}$. In other words, $V_0$ is a polarization voltage of the inverter block 27.

Particularly, the selecting means 31 presenting for example a switch for each of M−1 inverters 30 are able to select for each of said inverters 30 the voltage $V_{sig}$ or the voltage $V_0$, as it is shown in FIG. 3.

Assuming that all of the inventers 30 are substantially identical and denoting as $$G_{INV}^{max}$$

the maximum gain that the inverter block 27 is able to provide, the gain $G_{INV}(m)$ can be tuned based on the gain control word m in the following way:

$$G_{INV}(m) = \frac{G_{INV}^{max}}{M} \times (m + 1).$$

For achieving this expression, the first selecting means 31 are controlled so as to drive m inverters 30 under the voltage $V_{sig}$ and M−1−m inverters 30 under the voltage $V_0$.

The reference gain $$G_{INV}^0$$

can be found when m=0 as $$G_{INV}^0 = G_{INV}^{max}/M.$$

In this example, the capacitor block 29 can consist in only one capacitor having a constant capacitance $C_2$.

Current Generator 14

According to this type of control, the current generator 14 can present any suitable generator providing a constant biasing current $I_B$.

Locking Frequency Generator 12

Additionally, according to this type of control, the locking frequency $f_{clk}$ is unaffected by the control of the inversion gain $G_{INV}$. Thus, the locking frequency generator 12 can present a simple clock generator able to provide a constant locking frequency, having for example the optimal value $f_{clk}$ as defined above.

dB-Linear Control of the Gain

Relaxation Oscillator 18

According to the invention, a dB-linear control of the gain $G_{VTC}$ of the VTC 10 can be achieved by controlling in complementary way the gain $G_{INV}(m)$ of the inverter block 27 and the injection capacitance defined by the capacitor block 29. Particularly, in this case, the gain $G_{VTC}$ can be controlled based on the gain control word m according to the following expression:

$$G_{VTC}(m) \approx \frac{\pi C_1}{V_{INV}^0} \frac{G_{INV}^0(m+K)}{C_2^0(M-m+K)},$$

where:

$$G_{INV}^0$$

is a reference gain of the inverter block 27;

$$V_{INV}^0$$

is the inversion level of the inverter block 27 at the input common mode voltage $V_0$;

$$C_2^0$$

is a reference capacitance of the capacitor block 29;

K is a constant factor responsible in defining the tuning range and the control step.

In other words, as in the previous case, the inventor gain $G_{INV}$ of the inverter block 27 can be still controlled in a linear way but using the factor m+K instead of m+1, i.e.

$$G_{INV}(m) = G_{INV}^0(m+K).$$

Figure 4:
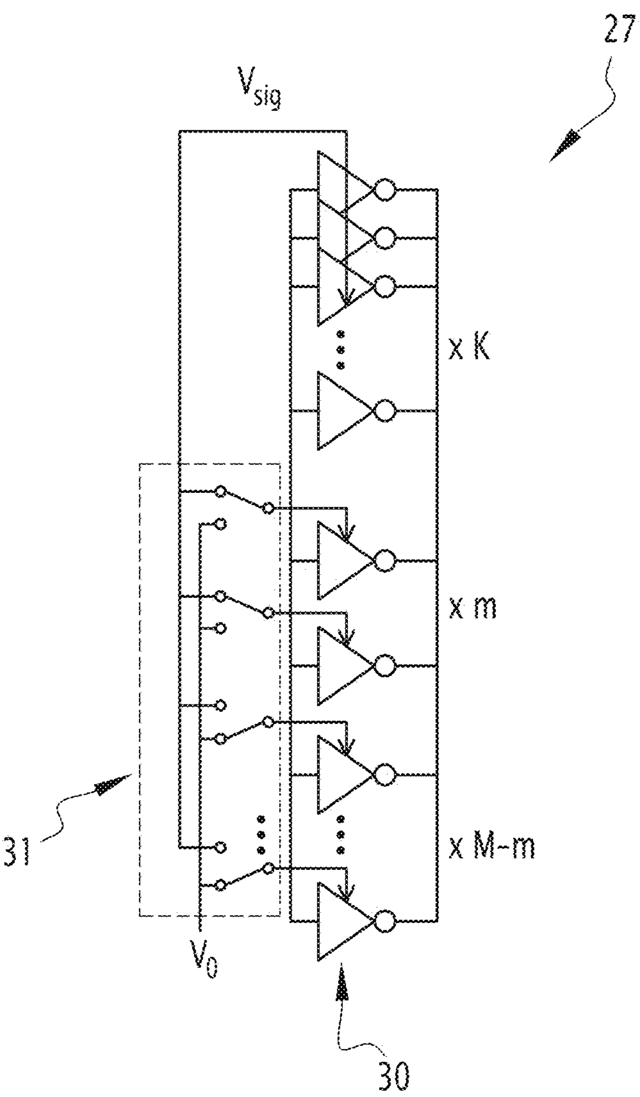

A possible embodiment of the inverter block 27 with a tunable gain $G_{INV}(m)$ for the purpose of dB-linear control is shown in FIG. 4. According to this Figure, the inverter block 27 comprises M+K inverters 30 connected in parallel and first selecting means 31. Among these M+K inverters 30, K inverters 30 are driven always by the input voltage signal $V_{sig}$ and M inverters 30 can be driven either by the input voltage $V_{sig}$ or the voltage $V_0$ different from the voltage $V_{sig}$. Particularly, the selecting means 31 presenting for example a switch for each of M inverters 30 are able to select for each of said inverters 30 the voltage $V_{sig}$ or the voltage $V_0$, as it is shown in FIG. 4.

Assuming that all of the inventers 30 are substantially identical and denoting as $$G_{INV}^{max}$$

the maximum gain that the block 27 is able to provide, the gain $G_{INV}(m)$ can be tuned based on the gain control word m in the following way:

$$G_{INV}(m) = \frac{G_{INV}^{max}}{M+K} \times (m+K).$$

For achieving this expression, the first selecting means 31 are controlled so as to drive m inverters 30 under the voltage $V_{sig}$ and M-m inverters 30 under the voltage $V_0$.

Contrary to the previous case, in this example, the reference gain $$G_{INV}^0$$

is given by the following expression:

$$G_{INV}^0 = G_{INV}^{max}/(M+K).$$

As mentioned above, the capacitor block 29 is tuned in a complementary way to achieve the dB-linear control of the gain $G_{VTC}(m)$. In other words, the capacitance $C_2$ is controlled linearly according to the following expression:

$$C_2 = C_2^0(M-m+K).$$

Figure 5:
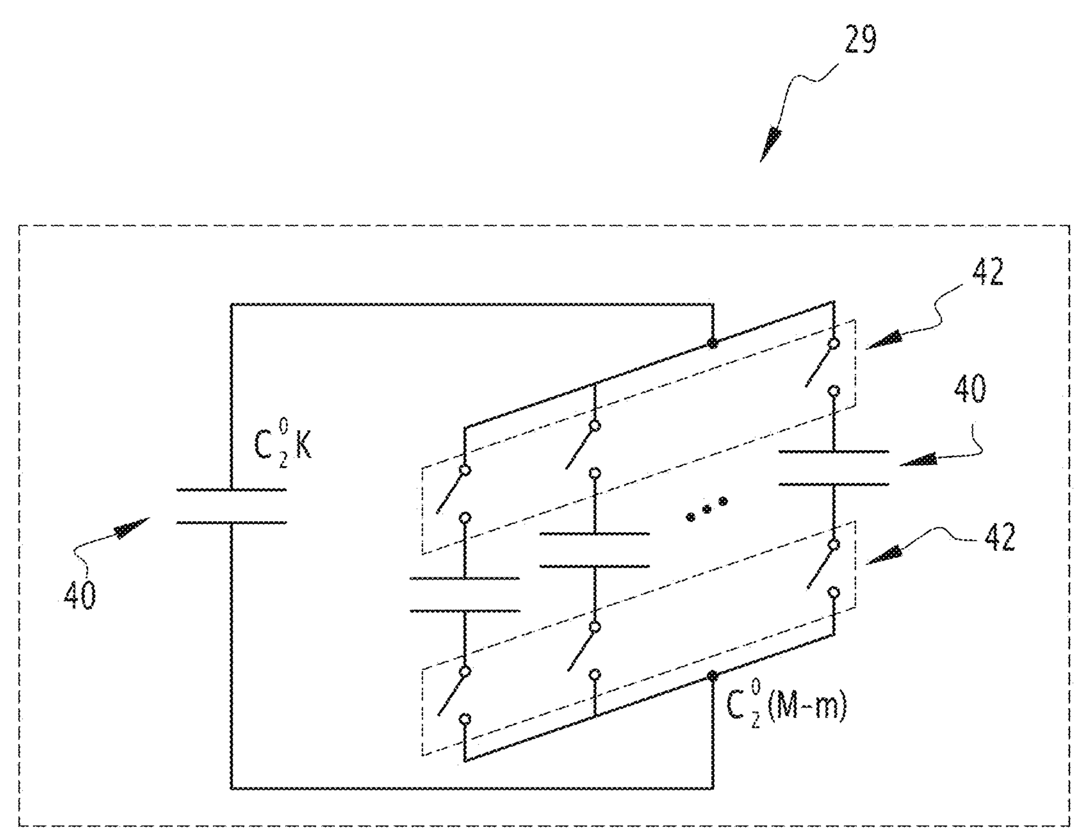

For this purpose, a possible embodiment of the capacitor block 29 is shown in FIG. 5. According to this embodiment, the capacitor block 29 comprises a plurality of capacitors 40 connected in parallel and second selecting means 42. Among the capacitors 40, one or a plurality of capacitors having their total capacitance equal to $$C_2^0 K$$

are driven always by the voltage $V_{clk}$. Each of the other capacitors 40 is either connected or disconnected from the circuit by the second selecting means 42 to ensure their total capacitance equal to $$C_2^0(M-m).$$

Current Generator 14

According to this type of control, the current generator 14 can present any suitable generator providing a constant biasing current $I_B$.

Locking Frequency Generator 12

In the case of dB-linear gain control, the injection capacitance $C_2$ is tuned leading to a variation in the required optimal value of $f_{clk}$. In this case, an adaptive locking frequency generator 12 providing a variable locking frequency $f_{clk}$ as function of the injection capacitance $C_2$ can be used.

Linear Control of the Bandwidth with a Linear Control of the Gain

Relaxation Oscillator 18

The architecture of the relaxation oscillator 18 is not affected by the linear control of the bandwidth. Thus, any one of the previously described architectures can be used for the relaxation oscillator 18 based on the desired control of the gain.

Current Generator 14

For linear control of the bandwidth, the biasing current $I_B$ issued from the current generator 14 is controlled in a linear way using the bandwidth control word h. Particularly, in this case, the bandwidth $f_{BW}$ of the VTC 10 is expressed in the following way:

$$f_{BW}(h) = \frac{1/2\pi}{V_{INV}^0 C_1^2} C_2 I_B(h).$$

Assuming that the basing current $I_B$ is linearly controlled so as:

$$I_B(h) = I_B^0 \times (h+1)$$

where $$I_B^0$$

is a reference current value, it is possible to control linearly the bandwidth $f_{BW}$(h). For this purpose, the current generator 14 comprises a controlling block 49 ensuring this type control of the biasing current $I_B$(h).

Figure 6:
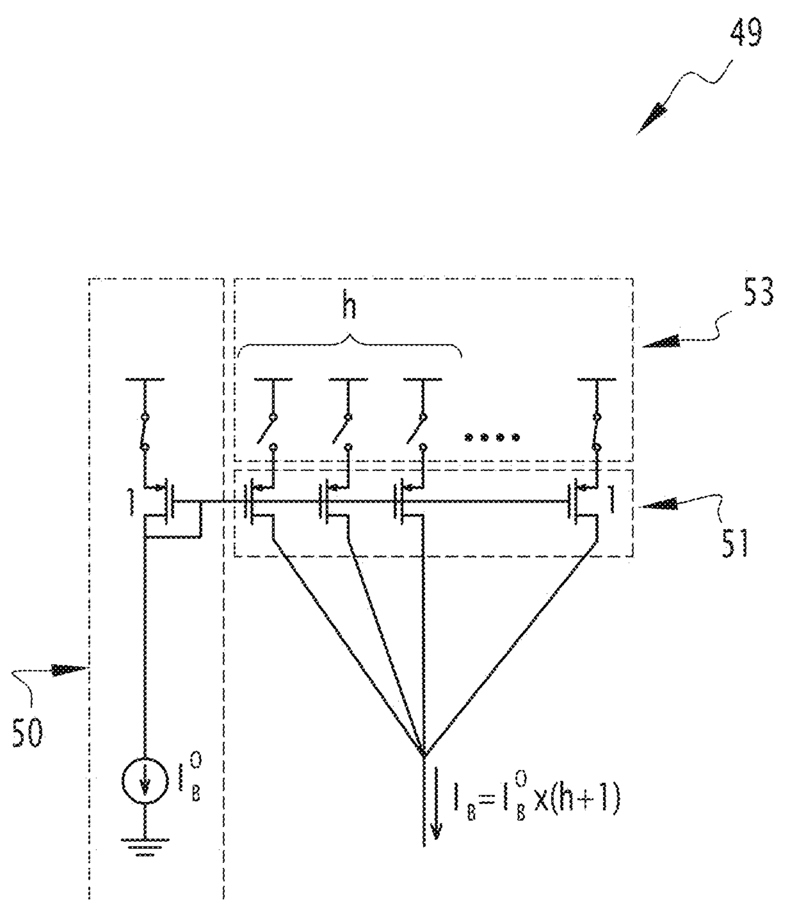

A possible embodiment of the controlling block 49 is shown in FIG. 6. According to this embodiment, the controlling block 49 comprises a current source 50 providing the reference current $$I_B^0$$

a plurality of transistors 51 connected in series to multiply the reference current $$I_B^0$$

and third selecting means 53 configured to connect/disconnect the transistors 51 so as to deliver the resulting current $I_B$(h). For this purpose, the third selecting means 53 may comprise a switch associated to each transistor 51. To achieve the resulting current $$I_B(h) = I_B^0(h+1),$$

the third selecting means 53 are able to connect to the circuit h+1 transistors 51.

Locking Frequency Generator 12

In the case of linear bandwidth control through the biasing current $I_B$, the required value of $f_{clk}$ is affected through the natural frequency $f_0 \infty I_B$. In this case, an adaptive locking frequency generator 12 providing a variable locking frequency $f_{clk}$ as function of the natural frequency $f_0$ can be used. Alternatively, the locking frequency generator 12 can comprise a free running relaxation oscillator 58 having the same biasing current $I_B$ as the relaxation oscillator 18.

Figure 8:
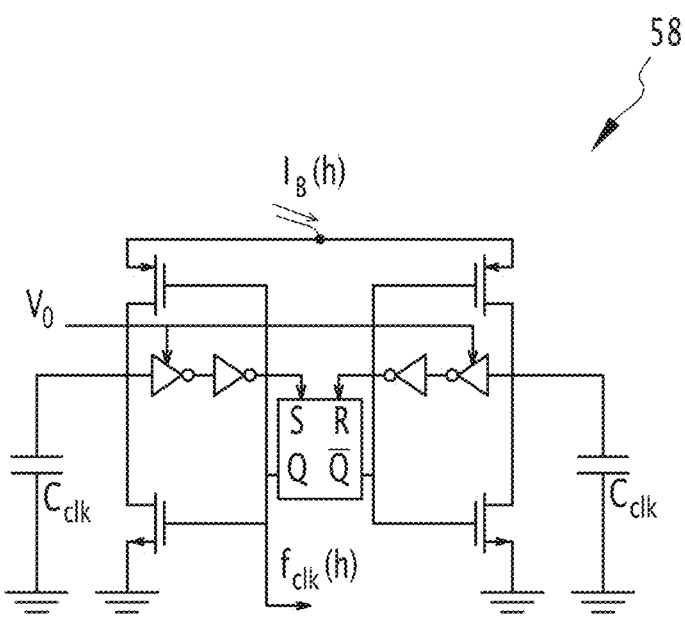

An example of such a relaxation oscillator 58 is shown in FIG. 8. This oscillator is similar to the one shown in FIG. 2 but contrary to this last, is provided without the injection branches 28. Additionally, the load capacitors $C_{clk}$ of the relaxation oscillator 58 are adapted to deliver the locking frequency $f_{clk}$ at the output defined by its optimal value as explained above. For this purpose, the capacitance of each load capacitor $C_{clk}$ can be defined as follows:

$$C_{clk} = C_1 \frac{1 + C_1/C_2}{0.5 + C_1/C_2}.$$

Linear Control of the Bandwidth With A Db-Linear Control of the Gain

Relaxation Oscillator 18

The architecture of the relaxation oscillator 18 is not affected in this case. Thus, any one of the previously described architectures can be used for the relaxation oscillator 18 based on the desired control of the gain.

Current Generator 14

As seen above, the bandwidth of the VTC 10 is a function of the injection capacitance $C_2$. Thus, its value is subject to change when the gain is tuned through $C_2(\overline{m})$ where $\overline{m}$=M−m+K. To compensate this variation an adaptive current bias, e.i., $I_B(1/\overline{m})$, is used.

For this purpose, in case of a linear control of the bandwidth with a dB-linear control of the gain, the current generator 14 further comprises a compensating block 59 connected in the input of the controlling block 49 as previously explained. In other words, in the example of FIG. 6, the output of the compensating block 59 is connected as the current source 50 of the controlling block 49. The compensating block 59 operates based on the gain control word m, as it shown in FIG. 1. In case of a linear-control of the bandwidth for a linear control of the gain, the compensating block 59 can be deactivated or the current generator 14 can be provided without this compensating block 59.

Figure 7:
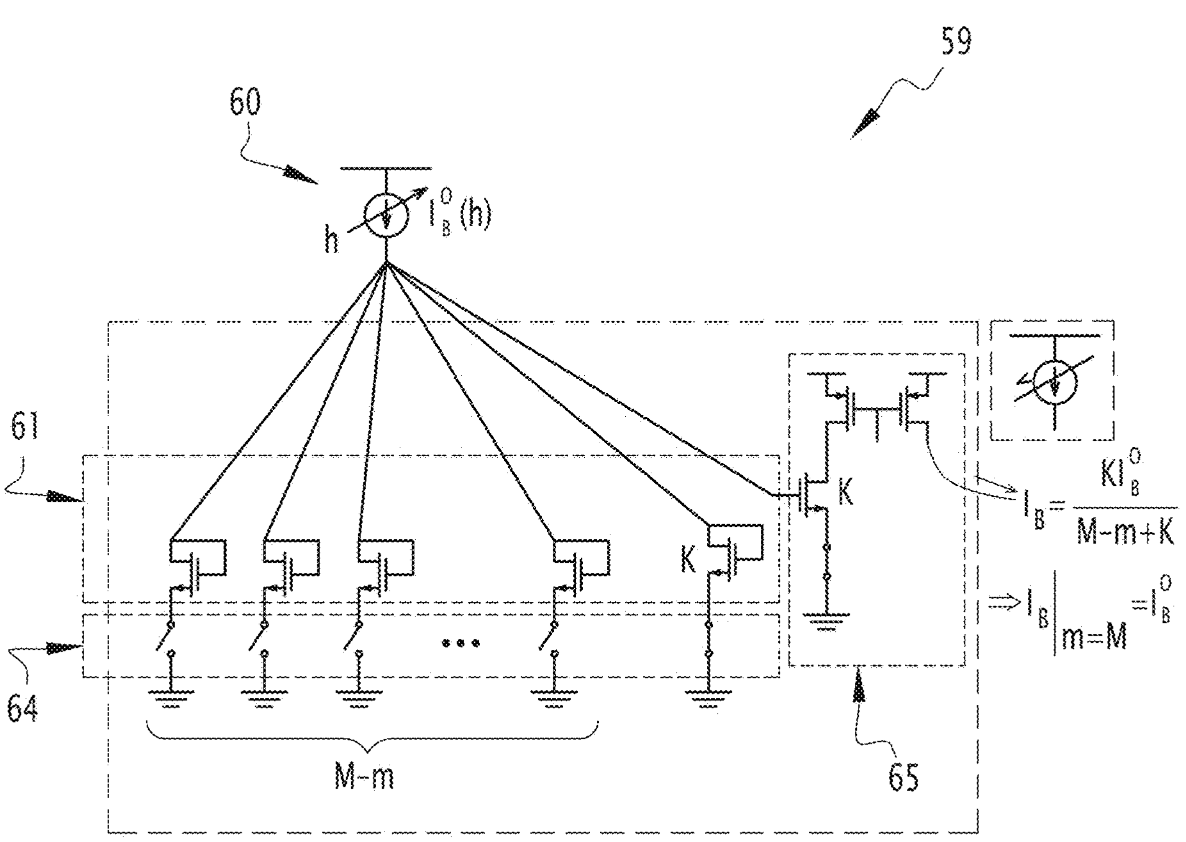

A possible embodiment of the compensating block 59 is shown in FIG. 7. According to this embodiment, the compensating block 59 comprises a current source 60 providing the reference current $$I_B^0$$

a plurality of transistors 61 connected to the current source 60 in a parallel way between them, fourth selecting means 64 configured to connect/disconnect the transistors and an output branch 65. Among the transistors, K transistors are connected permanently to the circuit and the fourth selecting means 64 are able to connect M-m transistors, to divide the reference current $$I_B^0$$

by the factor $\overline{m}$=M−m+K. The output branch 65 further comprises K permanently connected transistors to multiply the divided current by K, as the resulting current is defined according to the following expressions:

$$I_B = \frac{KI_B^0}{M-m+K}.$$

In a variant, instead of K permanently connected transistors, a unique transistor of size K can be used. In this case, the current needed to maintain the required bandwidth at the maximum gain (m=M) is equal to $$I_B^0$$

which can be easily set by the designer.

Locking Frequency Generator 12

As in the case of dB-linear gain control, in the present example, the injection capacitance $C_2$ is tuned leading to a variation in the required optimal value of $f_{clk}$. In this case, an adaptive locking frequency generator 12 providing a variable locking frequency $f_{clk}$ as function of the injection capacitance $C_2$ and the biasing current $I_B$ can be used.

Second Embodiment

Figure 9:
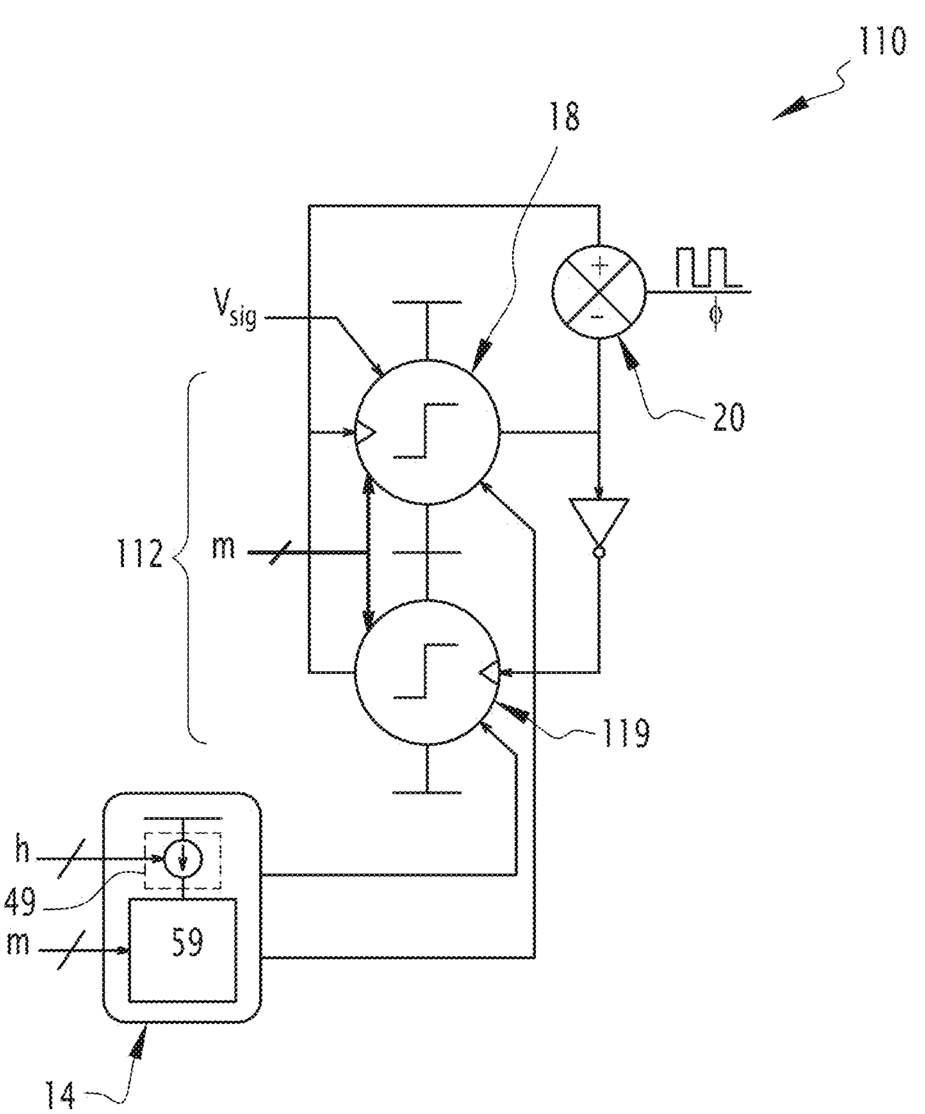
FIG. 9 is a schematic view of a voltage to time converter according to a second embodiment of the invention.

A VTC 110 according to a second embodiment is schematically shown in FIG. 9. The VTC 110 according to this embodiment is similar to the one of the first embodiment, explained in reference to FIG. 1. Particularly, this VTC 110 comprises a current generator 14, a relaxation oscillator 18 and a phase difference block 20 which are similar to those explained above and will not be explained in reference to this embodiment.

The VTC 110 according to the second embodiment also comprises a locking frequency generator 112 having a structure different from the one explained above.

Particularly, according to this embodiment, the locking frequency generator 112 is formed by a pair of self-locked-injection oscillators. One of these oscillators is the relaxation oscillator 18 as previously explained. The other oscillator, denoted in FIG. 9 by reference 119, is similar to the relaxation oscillator 18. However, the output of this oscillator 119 is connected to the input of the oscillator 18 and the output of the oscillator 18 is connected to the input of the oscillator 119.

Figure 10:
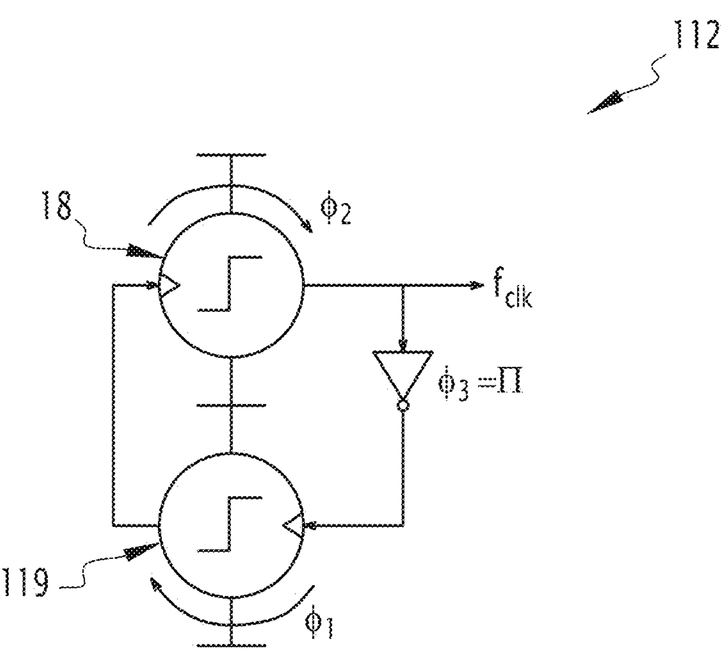
FIG. 10 shows the operation of a component of the voltage to time converter of FIG. 9.

Assuming, that both oscillators 18, 119 are connected in series and both run at frequency $f_{clk}$, as a result, each one creates a phase shift of $\pi/2$ between its input and its output, with a total phase shift of r. Under this assumption, the system formed by these oscillators 18, 119 can auto-oscillate by compensating the total phase shift $\pi$ and closing the loop, by providing the optimal value of the locking frequency $f_{clk}$ as previously explained. This principle is schematically shown in FIG. 10.

The locking frequency generator 112 is particularly advantageous when an accurate control of the locking frequency $f_{clk}$ is needed and/or its control is not simple. This is especially the case of dB-linear control of the gain. It should be noted that according to this embodiment, no adaptive clock is necessary since the system formed by the oscillators 18, 119 is auto-oscillating.

Third Embodiment

Figure 11:
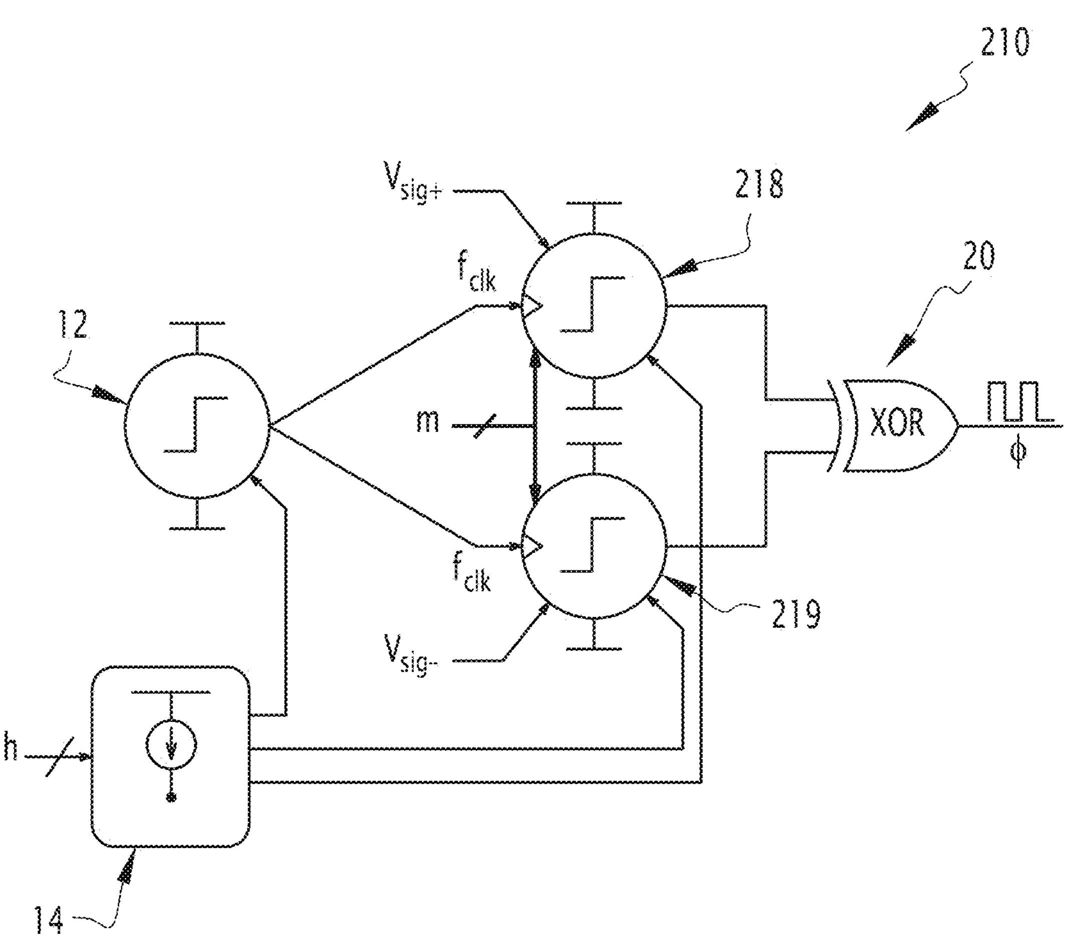
FIG. 11 is a schematic view of a voltage to time converter according to third embodiment of the invention.

A VTC 210 according to a third embodiment is schematically shown in FIG. 11. The VTC 210 according to this embodiment is similar to the VTC 10 according to the first embodiment, explained in reference to FIG. 1. Particularly, this VTC 210 comprises a current generator 14, a locking frequency generator 12 and a phase difference block 20 which are similar to those explained above and will not be explained in reference to this embodiment.

Contrary to the first embodiment, the input voltage signal $V_{sig}$ of the VTC 210 according to the third embodiment presents a differential signal defining a component $V_{sig+}$ and a component $V_{sig-}$. In this embodiment, the VTC 210 comprises a relaxation oscillator 218, 219 for each component of the differential signal $V_{sig}$. As shown in FIG. 11, the relaxation oscillators 218, 219 are connected in parallel between the locking frequency generator 12 and the phase difference block 20.

Particularly, each relaxation oscillator 218, 219 is similar to the relaxation oscillator 18 explained in reference to the first embodiment and is configured to output an output voltage signal from the corresponding component of the differential input signal $V_{sig}$ and the same locking frequency $f_{clk}$ provided by the locking frequency generator 12. The phase difference block 20 is configured to determine a phase difference $\phi$ between a first signal corresponding to the output voltage signal from the relaxation oscillator 218 and a second signal corresponding in this embodiment to the output voltage signal from the relaxation oscillator 219. As shown in FIG. 11, the phase difference block 20 is configured to apply the XOR logic between the received signals. The application of the XOR logic in this case is equivalent to a sum of two phases, each phase corresponding to the result of subtraction for each relaxation oscillator between its output voltage signal and the locking frequency $f_{clk}$. In other words, the application of the XOR logic comprises a determination of a phase based on the difference between the output voltage signal from at least one relaxation oscillator and the locking frequency $f_{clk}$.

The locking frequency generator 12 can be realized according to any one of the preceding examples. In the example of FIG. 11, the locking frequency generator 12 presents a free running relaxation oscillator similar to the one explained in reference to FIG. 8. Thus, in this example, the VTC 210 is particularly suitable for a linear control of gain and/or bandwidth.

Fourth Embodiment

Figure 12:
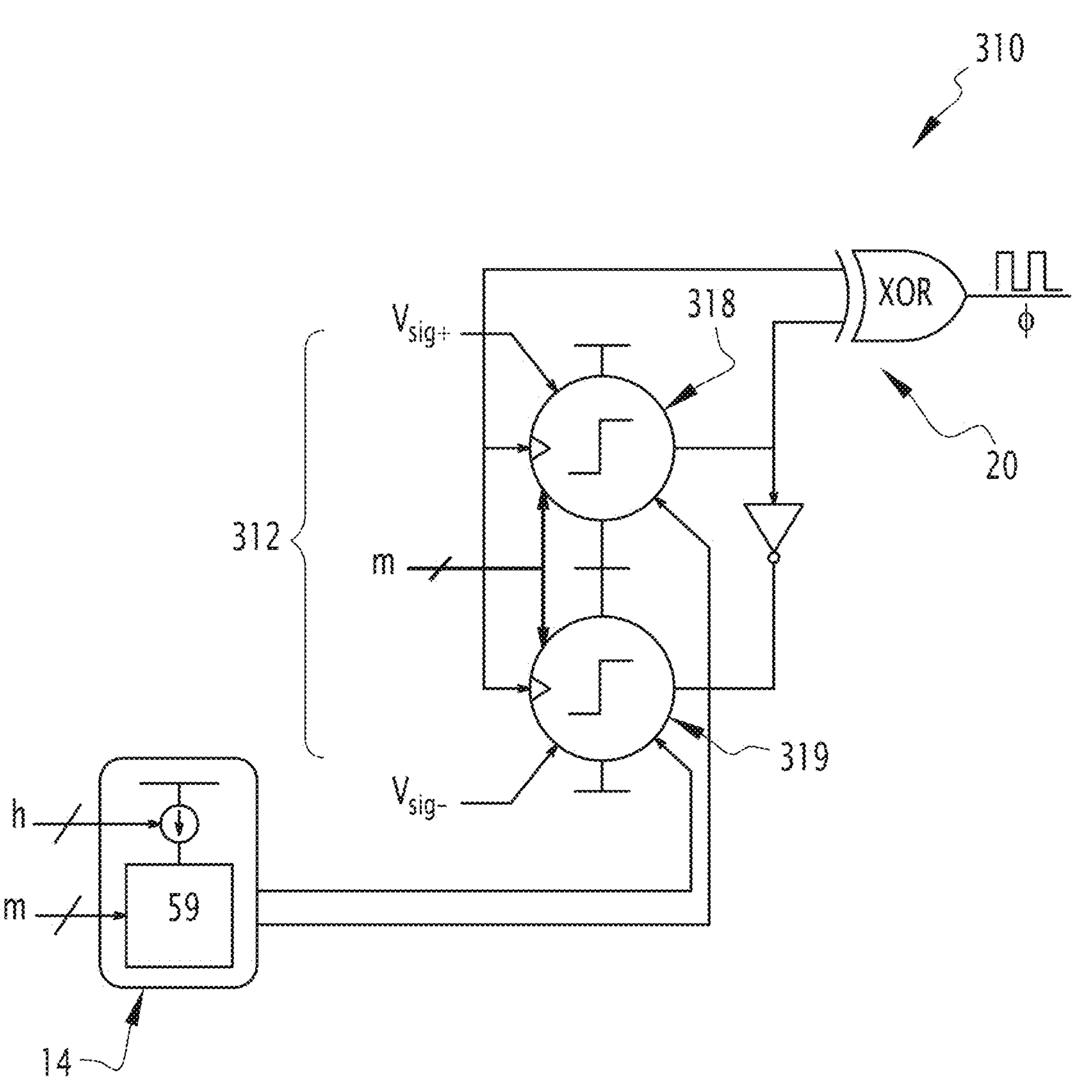
FIG. 12 is a schematic view of a voltage to time converter according to a fourth embodiment of the invention.

A VTC 310 according to a fourth embodiment is schematically shown in FIG. 12. The VTC 310 according to this embodiment is similar to the VTC 110 according to the second embodiment (explained in reference to FIG. 9) but is adapted to operate with a differential input signal $V_{sig}$ as explained in reference to the previous embodiment.

Particularly, this VTC 310 comprises a locking frequency generator 312 which is formed by a pair of self-locked-injection oscillators 318, 319. These oscillators 318, 319 are similar to the oscillators 218, 219 explained in relation with the previous embodiment. Particularly, each of these oscillators 318, 319 is run under the respective component $V_{sig+}$, $V_{sig-}$ of the differential input signal. Additionally, the output of the oscillator 319 providing the locking frequency $f_{clk}$ as explained above is connected to the input of the oscillator 318 and to the phase difference block 20. The output of the oscillator 318 is connected to the input of the oscillator 319 and to the phase difference block 20. The phase difference block 20 is configured to determine a phase difference $\phi$ between a first signal corresponding to the output voltage signal from the relaxation oscillator 318 and a second signal corresponding to the locking frequency $f_{clk}$ issued from the relaxation oscillator 319. As shown in FIG. 11, the phase difference block 20 is configured to apply the XOR logic between the received signals.

According to this embodiment, the VTC 310 can be used to control the bandwidth in a linear way and the gain in a linear or a dB-linear way.

Fifth Embodiment

Figure 13:
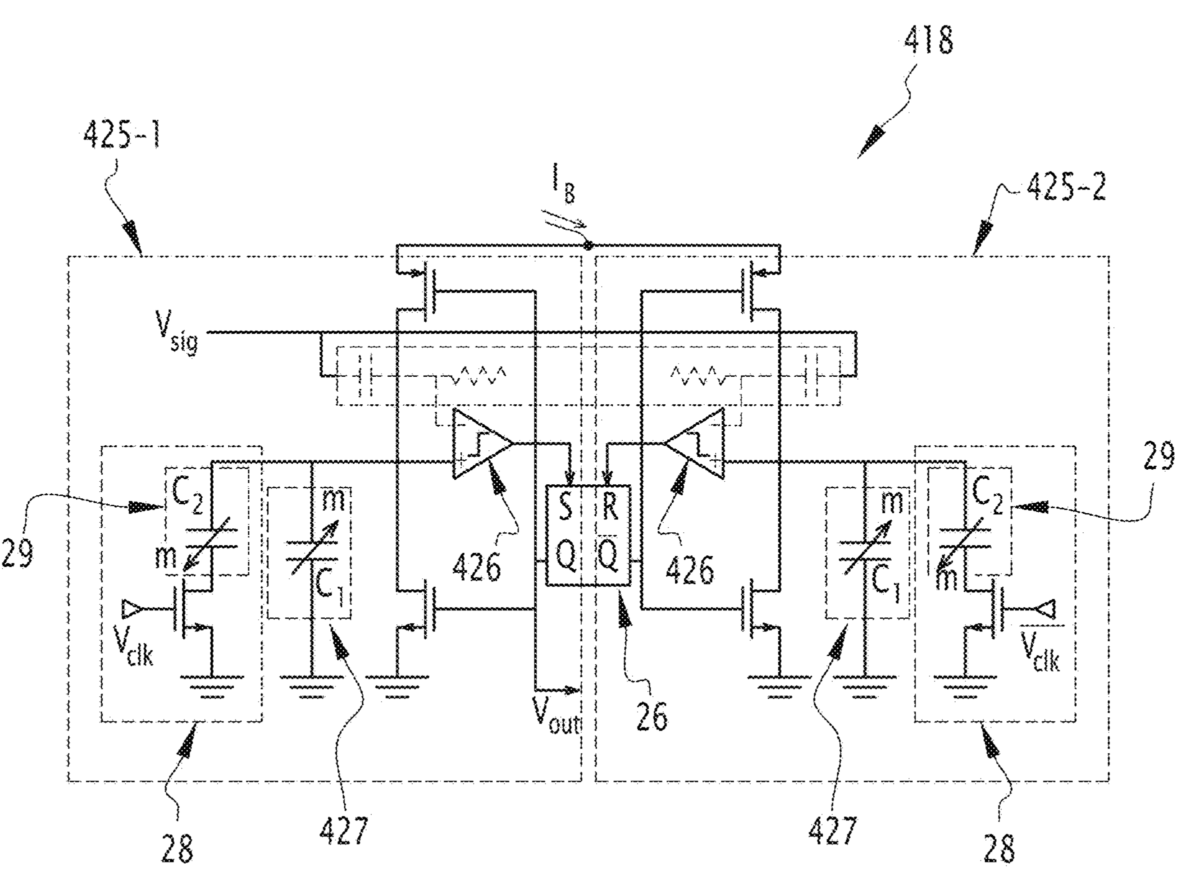
FIG. 13 is a schematic view of a component of a voltage to time converter according to a fifth embodiment of the invention.

The structure of a VTC according to a fifth embodiment can be similar to any one explained in reference with the previous embodiments. The only difference of the VTC according to this embodiment is the structure of a relaxation oscillator 418 which will be explained in further detail below in reference to FIG. 13.

As in the previous embodiments, the relaxation oscillator 418 is based on a capacitive injection locked oscillator structure, called C-ILO. Additionally, like in the previous embodiments, the oscillator 418 comprises two symmetrical parts 425-1, 425-2 powered by the biasing current $I_B$ and an RS latch 26 ("reset-set" latch) connected between the parts 425-1, 425-2. Also like in the previous cases, each part 425-1, 425-2 comprises a switched injection branch 28 comprising a capacitor block 29 having an injection capacitance $C_2$ which may be eventually controlled using the gain control word m as previously explained.

Contrary to the previously explained examples, instead of an input inverter block, each part 425-1, 425-2 of the relaxation oscillator 418 comprises a comparator 426 connected to the input voltage signal $V_{sig}$ via a DC-decoupling unity. The reference inversion level $$V_{INV}^{0}$$

here can be directly set by decoupling the input of the comparator 426 from the signal of interest. This decoupling also helps in reducing the input offset.

In this case, the inversion gain $G_{INV}$ as previously explained is substantially equal to 1 and the gain of the whole VTC can be found using the following expression:

$$G_{VTC}(m) \approx \frac{\pi}{V_{INV}^{0}} \frac{C_1}{C_2}.$$

Thus, linear gain control can be performed by tuning the capacitance $C_1$, while dB-linear gain control can be achieved by tinning both $C_1$ and $C_2$ in a complementary way.

For this purpose, instead of a simple load capacitor $C_1$ as previously explained, each part 425-1, 425-2 of the relaxation oscillator 418 comprises a load capacitor block 427 presenting a linearly controllable capacitance $C_1$ based on the gain control word m. This control can be carried out using a structure similar to the one shown and explained with reference to FIG. 5. Particularly, as in the case of FIG. 5, the load capacitor block 427 can have a plurality of capacitors configured to be connected in parallel by selecting means in order to control linearly the resulting capacitance.

The invention claimed is:

1. A programmable voltage to time converter, comprising:

a locking frequency generator configured to generate a locking frequency;

a current generator configured to generate a biasing current;

a relaxation oscillator configured to be powered by the biasing current and to generate an output voltage signal from the locking frequency, a gain control word, and an input voltage signal;

a phase difference block configured to determine a phase difference between a first signal corresponding to the output voltage signal and a second signal determined based on the locking frequency, wherein the relaxation oscillator comprises a component presenting a linearly controllable characteristic; and the voltage to time converter presents a gain linearly or dB-linearly controllable based on the gain control word by controlling linearly said linearly controllable characteristic of said component.

2. The programmable voltage to time converter according to claim 1, wherein said component is an input inverter block driven at least partially by the input voltage signal and connected to an output of the relaxation oscillator;

the input inverter block presents a gain linearly controllable based on the gain control word; and said characteristic corresponds to the gain of the input inverter block.

3. The programmable voltage to time converter according to claim 2, wherein the input inverter block comprises M inverters connected in parallel and first selecting means configured to control the gain of the input inverter block by selecting, among the M inverters, m inverters to be driven by the input voltage signal and at least M−m−1 inverters to be driven by a voltage signal different from the input voltage signal, m being a number defined based on the gain control word.

4. The programmable voltage to time converter according to claim 3, wherein the input inverter block further comprises K additional inverters configured to be driven by the input voltage signal, K being a constant; and the first selecting means is further configured to control the gain of the input inverter block by selecting, among M+K inverters, m inverters to be driven by the input voltage signal and M−m inverters to be driven by said voltage signal different from the input voltage signal.

5. The programmable voltage to time converter according to claim 1, wherein said component is a load capacitor block presenting a capacitance linearly controllable based on the gain control word;

said characteristic corresponds to the capacitance of the load capacitor block.

6. The programmable voltage to time converter according to claim 1, wherein the relaxation oscillator further comprises a switched injection branch configured to inject a voltage defined by the locking frequency, and further comprises a capacitor block defining an injection capacitance.

7. The programmable voltage to time converter according to claim 6, wherein the injection capacitance is set to be a constant for linear control of the gain of the voltage to time converter.

8. The programmable voltage to time converter according to claim 6, wherein the capacitor block comprises second selecting means configured to control the injection capacitance in a complementary way to said characteristic of said component, for a dB-linear control of the gain of the voltage to time converter.

9. The programmable voltage to time converter according to claim 8, wherein the second selecting means are further configured to control the injection capacitance in a linear way, based on the gain control word.

10. The programmable voltage to time converter according to claim 1, wherein the current generator is configured to generate the biasing current based on a bandwidth control word, for linear control of a bandwidth of the voltage to time converter.

11. The programmable voltage to time converter according to claim 10, wherein the current generator comprises a controlling block configured to linearly control the biasing current based on the bandwidth control word.

12. The programmable voltage to time converter according to claim 11, wherein the current generator further comprises a compensating block connected to an input of the controlling block and configured to generate, based on the gain control word, a current compensating variations of an injection capacitance.

13. The programmable voltage to time converter according to claim 1, wherein the locking frequency generator is formed by one of the following elements:

a regular clock to provide a constant locking frequency;

an adaptive clock to provide an adaptive locking frequency; and a free running relaxation oscillator powered by the biasing current and comprising a load capacitor defining a capacitance configured to provide an adaptive locking frequency.

14. The programmable voltage to time converter according to claim 1, wherein the locking frequency generator is formed by the relaxation oscillator and an additional relaxation oscillator connected to said relaxation oscillator to form an auto-oscillating system.

15. The programmable voltage to time converter according to claim 1, wherein the input voltage signal is a differential voltage signal having two components; and the programmable voltage to time converter further comprises a respective relaxation oscillator for each component of the input voltage signal.

16. The programmable voltage to time converter according to claim 15, wherein the first and second signals for the phase difference block correspond to output voltage signals issued from different relaxation oscillators.

17. The programmable voltage to time converter according to claim 1, wherein the second signal for the phase difference block is provided by the locking frequency.

* * * * *